United States Patent
Kao

(10) Patent No.: US 6,453,530 B1
(45) Date of Patent: Sep. 24, 2002

(54) TOOL FOR MOUNTING A CLIP TO A SOCKET

(75) Inventor: Tien Lu Kao, Cypress, CA (US)

(73) Assignee: FoxConn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/747,395

(22) Filed: Dec. 22, 2000

(51) Int. Cl.7 ................................................. B23P 11/00
(52) U.S. Cl. ..................................... 29/243.56; 29/267
(58) Field of Search ............................ 29/243.56, 278, 29/270, 425.6, 426.6, 229, 450, 451, 267, 268, 239, 758; 254/131

(56) References Cited

U.S. PATENT DOCUMENTS 5,953,863 A * 9/1999 Shibanushi et al. ...... 29/243.56

* cited by examiner

Primary Examiner—Robert C. Watson
(74) Attorney, Agent, or Firm—Wei Te Chung

(57) ABSTRACT

A tool (1) for mounting a heat sink clip (80) to a CPU socket (100) includes a handle (10) and a lever (40) pivotally attached to the handle. The handle includes a body (12) and first and second legs (14, 16). The second leg has two tabs (30) defining two first pivot holes (32) therein. The lever defines a second pivot hole (50). A pivot pin (60) is extended through the first and second pivot holes, thereby pivotally attaching the lever to the handle. The handle downwardly presses the clip to engage a first arm of the clip with a catch of the socket. The lever is rotated so that a bent portion (52) thereof inwardly pushes a second arm of the clip to engage with another catch of the socket. A spring (70) connected between the handle and the lever draws the lever back to its original position.

14 Claims, 3 Drawing Sheets

TOOL FOR MOUNTING A CLIP TO A SOCKET

BACKGROUND OF THE INVENTION

1. Field of the Invention

The present invention relates to a tool for a clip, and particularly to a tool for mounting a heat sink clip to a central processing unit socket.

2. Related Art

A heat sink placed in contact with a central processing unit (CPU) transfers heat away from the CPU through conduction. Oftentimes, a heat sink is secured to a CPU by a clip which is attached to a CPU socket.

A conventional clip securing a heat sink to a CPU comprises a pressing portion and a pair of first and second arms respectively depending from opposite ends of the pressing portion. Each arm defines an opening, for engagement of the arm with a corresponding catch of the socket. In assembly, the first arm is engaged with one catch. Then the second arm is stretched outwardly and moved downwardly by hand to engage with another catch. Engaging the second arm with the corresponding catch is unduly complicated and laborious.

Thus another kind of clip has been developed. The clip comprises two members. Each member has an arm, and each arm defines an opening. In assembly, a first arm is engaged with a first catch of a socket at the opening of the first arm. A handle of the second member is then pushed outwardly and downwardly, thereby causing a second arm to engage with a second catch of the socket at the opening of the second arm. The handle of the clip facilitates engagement of the second arm with the second catch. However, engaging the second arm is unduly laborious. Furthermore, contemporary heat sinks are being made larger and larger, and so the clips required to secure them need to be attached tighter and tighter. It is therefore often very difficult to secure a clip to a CPU socket merely by hand.

A tool for readily mounting a heat sink clip to a CPU socket which overcomes the above problems encountered in the prior art is strongly desired.

SUMMARY OF THE INVENTION

Accordingly, an object of the present invention is to provide a tool for readily mounting a heat sink clip to a CPU socket.

To achieve the above-mentioned object, a tool for mounting a heat sink clip to a CPU socket in accordance with the present invention comprises a handle and a lever pivotally attached to the handle. The handle comprises a body and first and second legs. The second leg has two tabs with two coaxial first pivot holes respectively defined therein. The lever defines a second pivot hole therein. A pivot pin is extended through the first and second pivot holes, thereby pivotally attaching the lever to the handle. A bent portion extends horizontally inwardly from a bottom end of the lever. A spring is connected between the handle and the lever. The two legs downwardly press the clip, whereupon a first arm of the clip engages with a catch of the socket. The lever is rotated so that the bent portion inwardly pushes a second arm of the clip, whereupon the second arm engages with another catch of the socket. The spring draws the lever back to its original position.

Other objects, advantages and novel features of the present invention will be drawn from the following detailed description of a preferred embodiment of the present invention with reference to the attached drawings, in which:

DESCRIPTION OF THE PREFERRED EMBODIMENT

Figure 1:
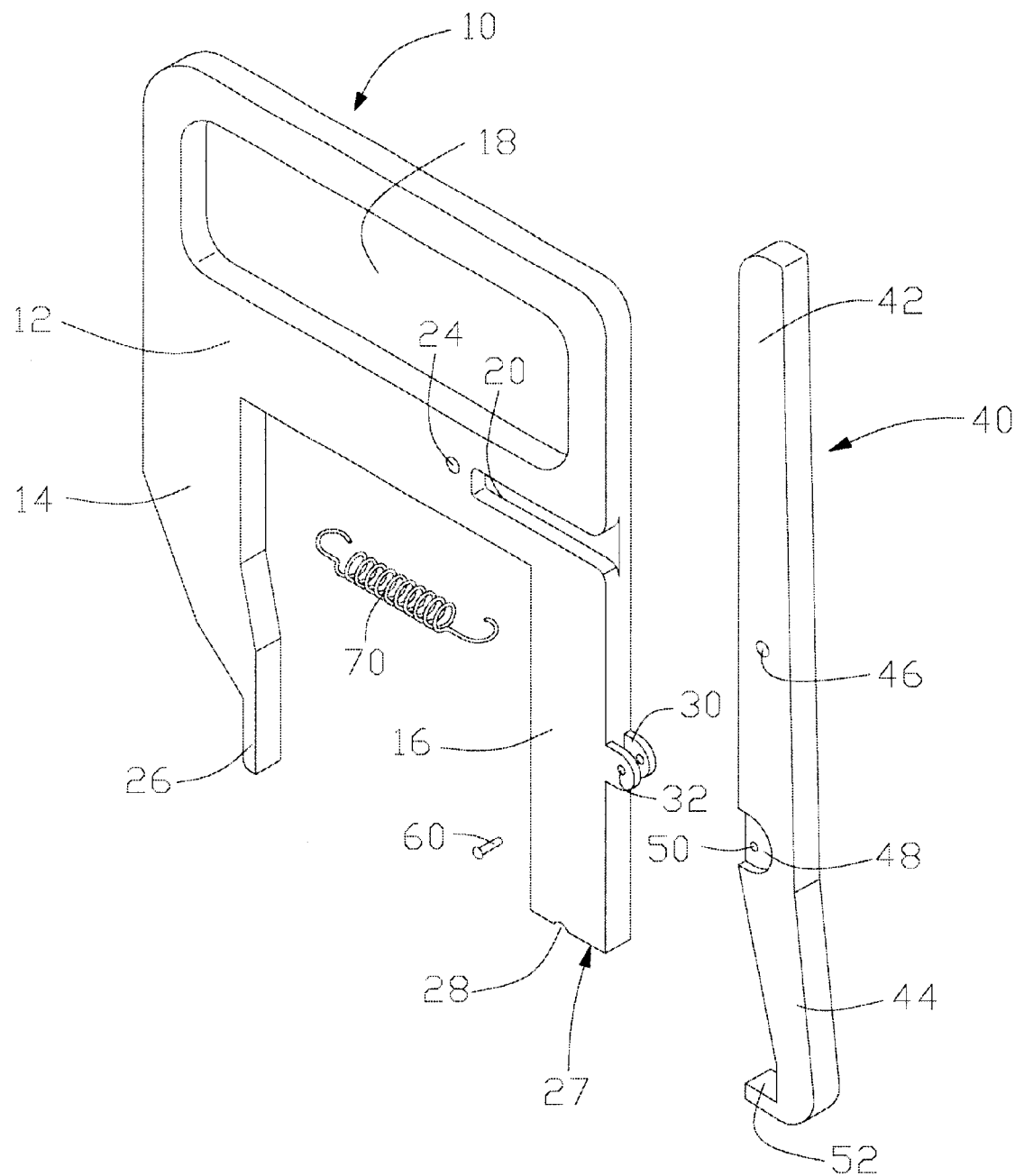
FIG. 1 is an exploded view of a tool in accordance with the present invention.

Referring to FIG. 1, a tool 1 in accordance with the present invention comprises a handle 10, a lever 40, a pivot pin 60 pivotally attaching the lever 40 to the handle 10, and a spring 70 connected between the handle 10 and the lever 40.

The handle 10 comprises a generally rectangular body 12, and a pair of first and second legs 14, 16 respectively depending from opposite sides of the body 12. An elongated opening 18 is defined in the body 12. A horizontal slot 20 is defined at the junction of a lower portion of the body 12 and an adjacent edge of the body 12. The slot 20 is disposed between the opening 18 and the second leg 16. A first retaining aperture 24 is defined in a lower portion of the body 12 at a side of the slot 20 opposite the said edge of the body 12.

The first leg 14 has a toe 26 at a bottom end thereof. The second leg 16 is generally rectangular in shape. A groove 28 is defined in a bottom surface 27 of the second leg 16. A pair of spaced tabs 30 respectively extends perpendicularly outwardly from an outer side edge of the second leg 16. A pair of coaxial first pivot holes 32 is respectively defined in the tabs 30.

The lever 40 comprises a vertical shaft 42, and an inclined tail 44 depending from a bottom end of the shaft 42. A second retaining aperture 46 is defined in the shaft 42, corresponding to the first retaining aperture 24 of the handle 10. A pair of spaced cutouts 48 (only one visible) is defined in an edge of a lower portion of the shaft 42. A pivot hole 50 is defined in the shaft 42 between the cutouts 48. A bent portion 52 extends horizontally inwardly from a bottom end of the tail 44.

In assembly, the lever 40 is placed against the handle 10, with the portion of the shaft 42 of the lever 40 between the cutouts 48 being placed between the tabs 30 of the handle 10. The pivot pin 60 is extended through the first pivot hole 32 of one tab 30, through the second pivot hole 50 of the lever 40, and finally into the first pivot hole 32 of the other tab 30. The spring 70 is accommodated in the slot 20 of the handle 10. One end of the spring 70 is retained in the first retaining aperture 24 of the handle 10, and the other end of the spring 70 is retained in the second retaining aperture 46 of the lever 40. Thus the lever 40 is pivotally attached to the handle 10, and the tool 1 is ready for use as a single unit (See FIG. 2).

Figure 2:
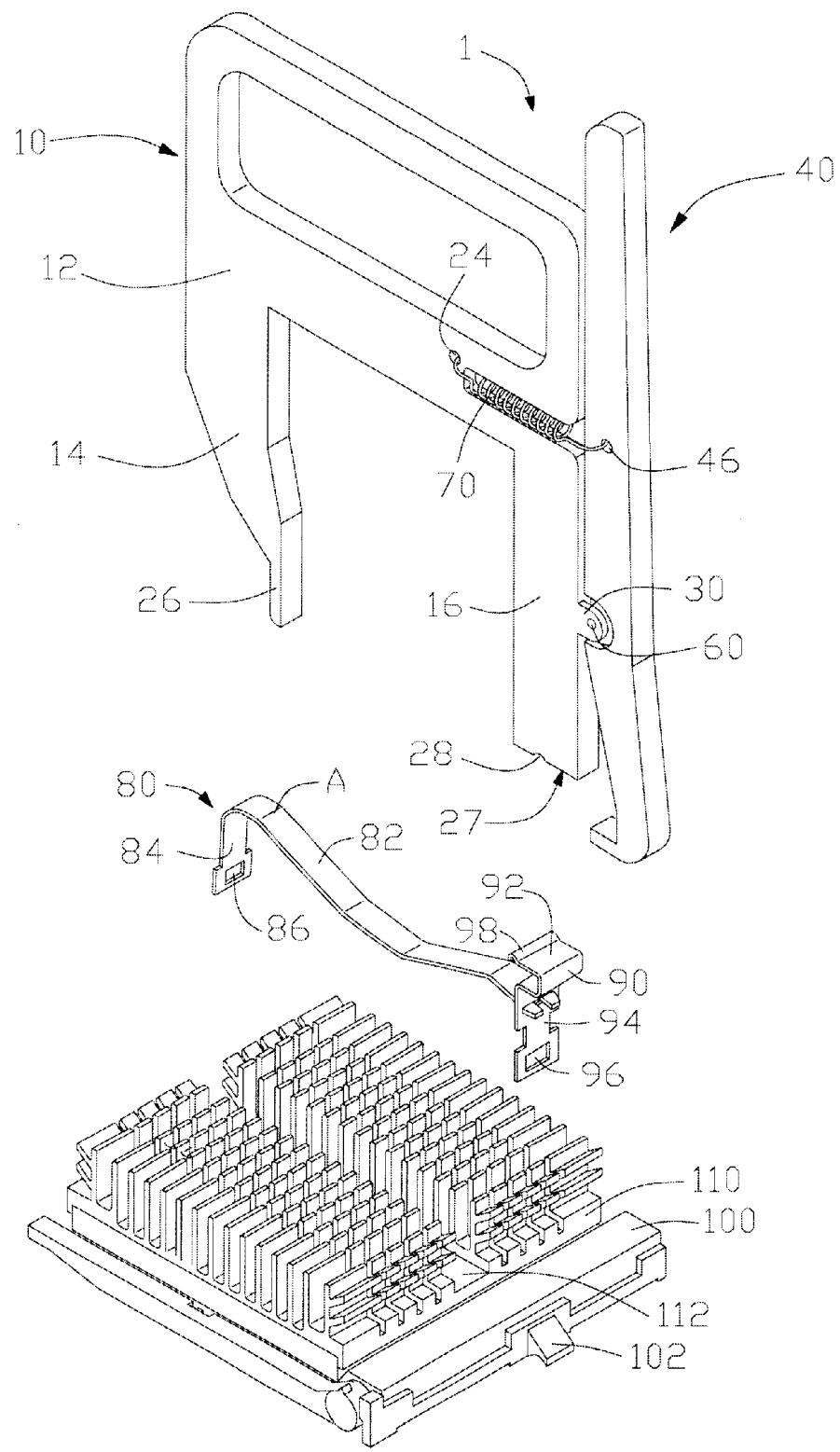
FIG. 2 is a perspective view of the tool of FIG. 1 now assembled, a heat sink clip, and a heat sink mounted on a CPU socket.

FIG. 2 shows the tool 1 for mounting a heat sink clip 80 to a CPU socket 100 on which a heat sink 110 is mounted.

The clip 80 comprises a first member 82, and a second member 90 attached at one end of the first member 82. The first member 82 has a first arm 84 with a first opening 86 defined therein for engaging with a catch 102 (not visible) of the socket 100. The second member 90 comprises a pressing portion 92 and a second arm 94. The pressing portion 92 has a ridge 98, corresponding to the groove 28 of the second leg 16 of the handle 10. The second arm 94 defines a second opening 96 corresponding to another catch 102 of the socket 100. The heat sink 110 has a central channel 112 defined therethrough.

Figure 3:
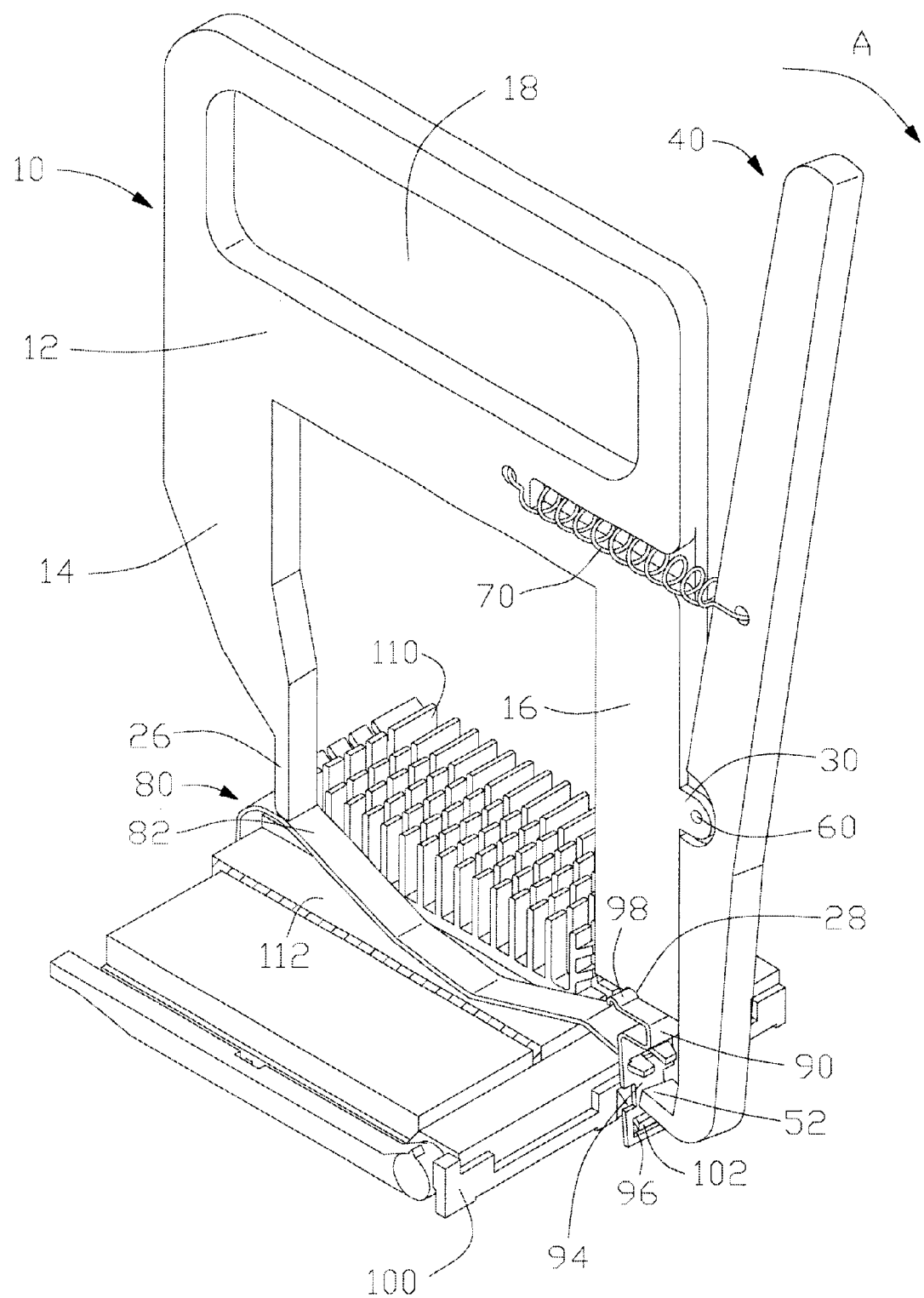
FIG. 3 is similar to FIG. 2, but showing the clip being mounted on the CPU socket by using the tool.

Referring also to FIG. 3, in operation, the clip 80 is placed on the heat sink 110 in the channel 112. The tool 1 is then placed on the clip 80. The toe 26 of the first leg 14 of the tool 1 abuts portion A (see FIG. 2) of the first member 82 near the first arm 84 of the clip 80. The bottom surface 27 of the second leg 16 of the tool 1 abuts the pressing portion 92 of the second member 90 of the clip 80. The ridge 98 of the second member 90 abuts the second leg 16 at the groove 28. The tool 1 is then pushed downwardly. Consequently, the first and second arms 84, 94 of the clip 80 are respectively stretched outwardly and moved downwardly. The first member 82 of the clip 80 is deformed accordingly As soon as the first and second openings 86, 96 of the clip 80 have slid over the catches 102 of the socket 100, pushing of the tool 1 is stopped. The first member 82 elastically deforms part of the way back to its original shape, and causes the first member 82 at the first opening 86 to engage with the corresponding catch 102 (not shown). The lever 40 of the tool 1 is then rotated in direction A (see FIG. 3), thereby stretching the spring 70. The bent portion 52 of the lever 40 inwardly pushes the second arm 94. Thus the second arm 94 at the second opening 96 is easily engaged with the corresponding catch 102. Rotation of the lever 40 is stopped. The spring 70 elastically deforms back to its original length, and thereby draws the lever 40 back to its original position.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A tool adapted for mounting a clip having first and second arms to a socket comprising:

a handle having a body and first and second legs extending from the body, the first and second legs being adapted for pressing the clip until the first arm of the clip engages with the socket; and a lever pivotally attached to the handle and adapted to push the second arm of the clip so that the second arm engages with the socket, wherein the second leg of the handle has at least one tab with a first pivot hole defined therein, the lever defines a second pivot hole therein, and a pivot pin extends into each first pivot hole and the second pivot hole thereby pivotally attaching the lever to the handle.

2. The tool as claimed in claim 1, wherein the lever has a bent portion adapted for inwardly pushing the second arm of the clip so that the second arm engages with the socket.

3. The tool as claimed in claim 1, wherein the tool further comprises an elastic member connected between the body of the handle and the lever.

4. The tool as claimed in claim 3, wherein the body of the handle defines a slot therein for accommodating the elastic member in the slot.

5. The tool as claimed in claim 3, wherein the body defines a first retaining aperture therein for retaining an end of the elastic member, and the lever defines a second retaining aperture therein for retaining another end of the elastic member.

6. The tool as claimed in claim 3, wherein the elastic member is a spring.

7. A tool adapted for mounting a clip having first and second arms to a socket comprising:

a handle having a body and first and second legs extending from the body, the body defining a slot therein, the first and second legs being adapted for pressing the clip until the first arm of the clip engages with the socket;

a lever pivotably attached to the handle and adapted to push the second arm of the clip so that the second arm engages with the socket; and an elastic member connected between the body of the handle and the lever and accommodated in the slot, wherein the body defines a first retaining aperture therein for retaining an end of the elastic member, and the lever defines a second retaining aperture therein for retaining another end of the elastic member.

8. The tool as claimed in claim 7, wherein the second leg of the handle has at least one tab with a first pivot hole defined therein, and the lever defines a second pivot hole therein, and wherein a pivot pin extends into each first pivot hole and the second pivot hole thereby pivotally attaching the lever to the handle.

9. The tool as claimed in claim 7, wherein the lever has a bent portion adapted for inwardly pushing the second arm of the clip so that the second arm engages with the socket.

10. A tool mounting a clip to a socket, the socket having a pair of catches on opposite sides thereof, the clip comprising a first member and a second member attached to one end of the first member, the first member comprising a first arm defining a first opening for engagement with one of the catches, the second member comprising a pressing portion and a second arm defining a second opening for engagement with the other of the catches, the tool comprising:

a handle comprising a first leg pressing the first member near the first arm to thereby enable said one of the catches engage in the first opening, and a second leg pressing the pressing portion of the second member; and a lever pivotally attached to the handle, the lever having a bent portion inwardly pressing the second arm of the second member to thereby enable said the other of the catches to engage in the second opening.

11. The tool as claimed in claim 10, wherein the second leg of the handle has at least one tab with a first pivot hole defined therein, and the lever defines a second pivot hole therein, and wherein a pivot pin extends into each first pivot hole and the second pivot hole thereby pivotally attaching the lever to the handle.

12. The tool as claimed in claim 10, wherein the second leg defines a groove in a bottom surface thereof, receiving a ridge of the pressing portion of the clip.

13. The tool as claimed in claim 10, wherein the handle further comprises a body, the body defines a slot accommodating an elastic member and a first retaining aperture retaining an end of the elastic member, and the lever defines a second retaining aperture retaining another end of the elastic member.

14. In combination, a socket with a chip thereon, a heat sink seated upon the chip;

a clip including a first member and a second member pivotally retained to said first member, said first member including a first opening to be engaged with a first catch on the socket, said second member including a second opening to be engaged with a second catch on the socket, said second member further including a pressing portion located above the first member;

a tool including a handle and a lever pivotally retained to said handle, said handle including means around a bottom portion thereof for engagement with said pressing portion, and said lever including means around a bottom portion thereof for inwardly pushing the second member in a rotative manner relative to the first member for easy engagement between the second opening and said catch.

* * * * *